United States Patent [19]

Brennan et al.

[11] Patent Number: 5,048,038
[45] Date of Patent: Sep. 10, 1991

[54] ION-IMPLANTED PLANAR-BURIED-HETEROSTRUCTURE DIODE LASER

[75] Inventors: Thomas M. Brennan, Albuquerque; Burrell E. Hammons, Tijeras; David R. Myers; Gregory A. Vawter, both of Albuquerque, all of N. Mex.

[73] Assignee: The United States of America as represented by the United States Department of Energy, Washington, D.C.

[21] Appl. No.: 469,996

[22] Filed: Jan. 25, 1990

[51] Int. Cl.$^5$ .................................................. H01S 3/19
[52] U.S. Cl. ........................................ 372/46; 372/45; 357/16; 357/17
[58] Field of Search ................... 372/46, 45; 357/16, 357/17

[56] References Cited

U.S. PATENT DOCUMENTS

| Re. 31,806 | 1/1985 | Scifres et al. | 372/50 |
|---|---|---|---|
| 4,433,417 | 2/1984 | Burnham et al. | 372/45 |
| 4,523,961 | 6/1985 | Hartman et al. | 148/1.5 |
| 4,639,275 | 1/1987 | Holonyak, Jr. | 372/46 |
| 4,660,208 | 4/1987 | Johnston, Jr. et al. | 372/46 |
| 4,706,255 | 11/1987 | Thornton et al. | 372/50 |
| 4,824,798 | 4/1989 | Burnham et al. | 437/81 |

OTHER PUBLICATIONS

R. Thornton et al., "Low Threshold Planar Buried Heterostructure Lasers Fabricated by Impurity-Induced Disordering", *Applied Physics Letters*, vol. 47, No. 12, Dec. 15, 1985, pp. 1239-1241.

Primary Examiner—Georgia Epps
Attorney, Agent, or Firm—Karla Ojanen; James H. Chafin; William R. Moser

[57] ABSTRACT

A Planar-Buried-Heterostructure, Graded-Index, Separate-Confinement-Heterostructure semiconductor diode laser 10 includes a single quantum well or multi-quantum well active stripe 12 disposed between a p-type compositionally graded Group III-V cladding layer 14 and an n-type compositionally graded Group III-V cladding layer 16. The laser 10 includes an ion implanted n-type region 28 within the p-type cladding layer 14 and further includes an ion implanted p-type region 26 within the n-type cladding layer 16. The ion implanted regions are disposed for defining a lateral extent of the active stripe.

10 Claims, 2 Drawing Sheets

ION-IMPLANTED PLANAR-BURIED-HETEROSTRUCTURE DIODE LASER

The Government has rights in this invention pursuant to Contract No. DE-AC04-76DP00789 awarded by the U.S. Department of Energy to AT&T Technologies, Inc.

FIELD OF THE INVENTION

This invention relates generally to semiconductor lasers and, in particular, to a Planar-Buried-Heterostructure, Graded-Index, Separate-Confinement-Heterostructure (PBH-GRIN-SCH) laser fabricated by ion-implantation by two dopant species into a semiconductor material.

BACKGROUND OF THE INVENTION

Planar-buried-heterostructure (PBH) semiconductor diode lasers incorporate a two-dimensional variation of a semiconductor energy bandgap for confinement of electron-hole recombination and formation of an optical waveguide within an area of minimum energy bandgap. In such a device an overall planarity of the diode laser device surface is beneficial as it simplifies processing as well as facilitating an optoelectronic integration of multiple devices upon a single wafer. Device planarity has typically been maintained either by regrowth of high bandgap epitaxial material within etched grooves or by the application of diffusion-induced disordering of an as-grown heterostructure.

Reverse biased p-n junctions are typically provided by sequential regrowth of epitaxial material of different doping or by multiple diffusions of different dopants from the surface of the device. All known PBH lasers have employed variations of these techniques to form the required two-dimensional energy bandgap variation.

By example, in "Long-wavelength Semiconductor Lasers", Van Nostrand Reinhold Co. New York, at pages 193-204 G. P. Agrawal and N. K. Dutta provide a review of several PBH-type lasers, including a double-channel planar-buried-heterostructure (DCPBH) laser, fabricated by the epitaxial regrowth of one or more layers. The DCPBH laser is an illustrative example of the complex processing required by these and similar structures. In order to fabricate a DCPBH laser device originally planar epitaxial layers must be chemically etched to form two grooves on either side of the desired laser active region. Subsequently, wide energy bandgap material is regrown inside the grooves with a carefully placed n-type current-blocking layer being included. Growth of the current-blocking layer is critical since the layer must not cover the active-region stripe and thus block current flow to the active layer.

As another example, in a journal article entitled "Low threshold planar buried heterostructure lasers fabricated by impurity-induced disordering", Appl. Phys. Lett. 47 (12), 12/15/85, pp. 1239-1241 Thornton et al. report a PBH laser featuring high temperature diffusion-induced disordering. A high-temperature Si diffusion from a sample surface is employed to compositionally disorder a laser active region to form an optical waveguide and a low energy bandgap recombination region. However, this technique has a disadvantage of leaving highly doped material between the disordered active region and the wafer surface. As a result formation of desired reversed-biased current-blocking regions is difficult, requiring multiple high-temperature diffusion steps and resulting in a non-optimal current-blocking configuration.

In U.S. Pat. No. 4,660,208, issued Apr. 21, 1987, Johnston et al. disclose semi-insulating (SI) Fe-doped InP for use as a current blocking layer in regrown buried-heterostructure (BH) lasers. The technique grows or implants a thin Fe-doped SI InP layer and subsequently regrows the actual laser active layer and top p-type cladding inside of a groove and over the SI InP. The resulting structure forces current to flow around the highly resistive SI material and through the laser active region in order to obtain the high degree of current confinement required for laser structures. An alternative discussed reverses the order of fabrication and grows SI InP within grooves etched in a surface.

However, this structure requires regrowth of semiconductor material over non-planar structures. Other disadvantages relate to the difficulty, expense and low yield of semiconductor regrowth processes. Furthermore, the interface between the first growth and the second growth typically has a high concentration of defects. These defects cause non-radiative recombination of electrons and holes if the p-n junction is allowed to contact the interface.

In U.S. Pat. NO. 4,433,417, Feb. 21, 1984 Burnham et al. teach a non-planar laser grown by MOCVD processes on a non-planar substrate. All but one of the resulting structures have little or no current confinement beyond what is obtained by a conventional proton implant into the surface above the active and waveguide layers. Waveguiding of the laser mode is obtained by thickness variations and bends in the active laser medium created by growth over non-planar substrates. None of the structures disclosed employ the highly efficient BH concept for simultaneous current and radiation confinement. The only structure disclosed in this patent having current confinement more sophisticated than a simple proton implant is illustrated in FIG. 4 and discussed at Col. 8, line 61 to Col. 9, line 42. Here the laser is grown over a set of grooves to provide an optical waveguide. A top surface of the wafer, except for the very top of a ridge which will become the laser, is converted to p-type material prior to regrowth. This method is similar to that disclosed above in U.S. Pat. No. 4,660,208 and suffers from similar drawbacks of complicated regrowth technology and low quality regrown interfaces. Furthermore, this technique results in the creation of a non-planar surface after regrowth. In U.S. Pat. No. Re. 31,806, Jan. 15, 1985, Scrifres, et al. discuss various means for controlling the optical modes of multi-stripe laser arrays for high power applications. There is disclosed implantation or diffusion above an active layer of the device as a means to control the refractive index profile across the device by modulating the injected current density. However, Zn-diffused or implanted regions are intended only to provide the lateral index shift required for coupled-stripe laser operation. An n-type cap layer is said to be employed to confine current injection to the Zn-diffused or implanted stripes in order to enhance the refractive index shift. However, none of the structures disclosed employs implantation or diffusion into the active layer as a means to fabricate a BH type laser.

It is thus an object of the invention to provide for the implantation into a prepared substrate to fabricate a BH type laser.

It is a further object of the invention to provide a single semiconductor growth step and subsequent fabrication of a BH laser by implantation of ions into, and eventual disordering of, a laser active layer outside of a desired laser stripe.

It is a still further object of the invention to provide a single semiconductor growth step and subsequent fabrication of a PBH laser by the implantation of two different doping species into a heterostructure to create reversed-biased current-blocking junctions within a plane of a laser active layer.

SUMMARY OF THE INVENTION

The foregoing problems are overcome and the objects of the invention are realized by a method of fabricating a buried heterojunction planar laser diode and a diode so fabricated. The method includes the steps of providing a Group III-V heterostructure including a multi-quantum well active layer vertically confined between a p-type cladding layer and an n-type cladding layer and impurity disordering the heterostructure to delineate an active laser stripe. In accordance with the invention, the step of impurity disordering the heterostructure includes the steps of implanting a first chemical species into the heterostructure to create a first impurity doped and compensated within the active layer and at least a portion of one of the cladding layers, implanting a second chemical species into the heterostructure to create a second impurity doped and compensated region within the active layer and at least a portion of the other one of the cladding layers and activating the first and the second chemical species. The step of activating is accomplished by a rapid thermal anneal.

Further in accordance with the invention a Planar-Buried-Heterostructure, Graded-Index, Separate-Confinement-Heterostructure semiconductor diode laser includes a multi-quantum well active stripe disposed between a p-type compositionally graded Group III-V cladding layer and an n-type compositionally graded Group III-V cladding layer. The laser further includes an ion implanted n-type region within the p-type cladding layer and also includes an ion implanted p-type region within the n-type cladding layer. The ion implanted regions are disposed for defining a lateral extent of the active stripe.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
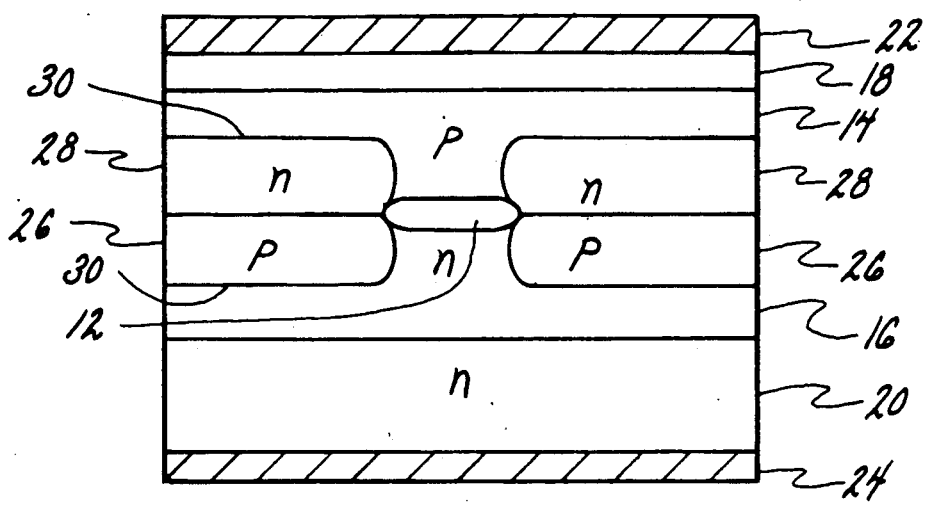
FIG. 1 is a cross-sectional view, not to scale, showing a semiconductor diode laser constructed in accordance with the invention.

An all-implanted PBH semiconductor diode laser 10 constructed in accordance with the invention is shown in cross-section in FIG. 1. The laser 10 of FIG. 1 is not drawn to scale. An active region 12 is contained between a p-type upper cladding layer 14 and an n-type lower cladding layer 16. The active region 12 may be a single quantum well region or a multi-quantum well region. A contact layer 18 is provided over cladding layer 14. The lower cladding layer 16 is formed upon an n-type substrate 20. An upper surface and a lower surface of the laser 10 are each provided with an ohmic contact in the form of an upper contact layer 22 and a lower contact layer 24, respectively.

In this structure, a two-dimensional energy bandgap variation is created by the compositional disordering phenomenon. Compositional disordering is achieved, in accordance with the invention, by ion implantation of dopant species into regions not desired for use as an active laser region. Specifically a p-type dopant is implanted to form the compensated regions 26 while an n-type dopant is implanted to form the compensated regions 28. Regions 26 and 28 surround the laser stripe or active region 12 on both sides thereof. Furthermore, the capability of ion implantation to accurately tailor a doping profile within a device provides for the formation of reverse-biased p-n junctions 30 outside of the desired laser active region. Reverse-biased junctions 30 are formed by the implantation of the p-type dopant into the n-type material of the lower cladding layer 16 and by the implantation of the n-type dopant into p-type material of the upper cladding layer 14. These reverse-biased current-blocking junctions placed on both sides of the active region by ion implantation force the injected current through the active region whose boundaries are defined by the implant. Impurity induced disordering does smear the active region quantum well into the upper and lower cladding layers outside the desired active area, but this effect, in and of itself, does not provide significant confinement of injected current into the desired active region.

Subsequent to the ion implantation step the dopants are activated by a rapid thermal anneal, thereby completing the compositional disordering process responsible for formation of the optical waveguide and two-dimensionally confined low energy bandgap electron-hole pair recombination region. The resulting laser 10 thus is characterized by relatively large energy bandgap cladding layers 14 and 16 that vertically confine the narrow bandgap active region 12 and by the adjacent implantation-doped and compensated regions 26 and 28 to create reverse biased current-blocking junctions that laterally confine the active region 12.

This structure has several advantages over the traditional techniques for fabrication of PBH lasers. Firstly, ion implantation is a well characterized technology that does not significantly affect the device surface morphology or planarity. Thus, subsequent process steps are performed on the as-grown planar wafer surface. Secondly, ion implantation is a low temperature process compatible with conventional metal or photoresist implant mask materials and is widely used for the fabrication of active electronic elements such as transistors, integrated circuits and photodetectors. This low temperature processing does not preclude optoelectronic integration of the PBH laser 10 with active electronic elements which are unable to withstand the high temperatures required for epitaxial regrowth or diffusion processes. The ion implanted laser 10 also does not preclude the development of self-aligned process sequences having only one or two masking steps. In contradistinction, the use of high-temperature diffusion or epitaxial growth frequently involves up to a dozen different mask levels. As a result, use of the less complex ion-implantation process of the invention provides significant improvements in manufacturability, yield, and reduced cost per laser device.

Figure 2:
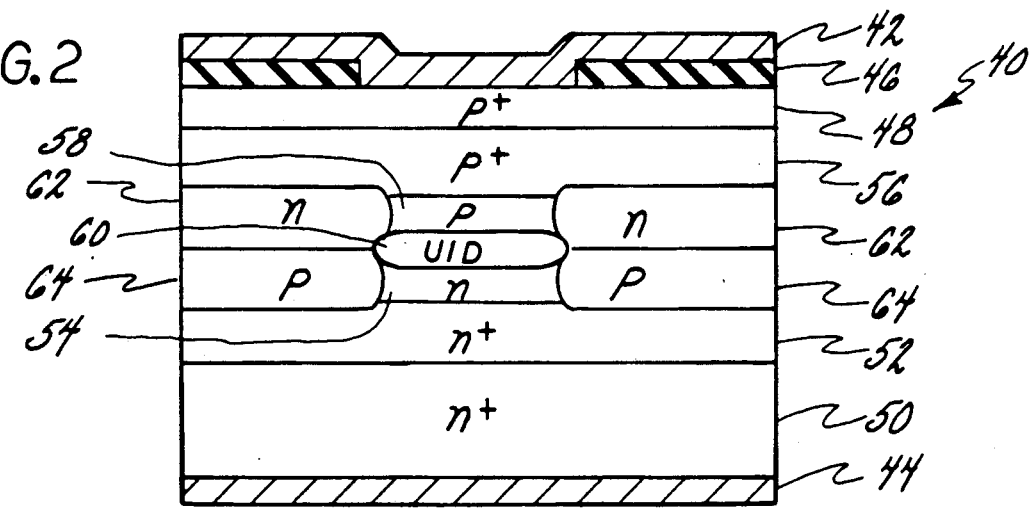
FIG. 2 is a cross-sectional view, not to scale, showing in greater detail a semiconductor diode laser constructed in accordance with the invention.

A specific embodiment of the invention is illustrated in FIG. 2. An all-implanted Planar-Buried- Heterostructure, GRaded-INdex, Separate-Confinement- Heterostructure (PBH-GRIN-SCH) laser 40 is comprised of GaAs/AlGaAs. Laser 40 includes an upper ohmic contact 42 and a lower ohmic contact 44. Ohmic contact 42 is applied over a windowed oxide layer 46 such that contact is made with a p+ GaAs contact layer 48. Layer 48 has a thickness of approximately 1000 Angstroms. The lower ohmic contact 44 is applied to a lower surface of an n+ GaAs substrate 50. Overlying an upper surface of the substrate 50 is the lower cladding layer that includes a first portion 52 comprised of n+ $Al_{0.4}Ga_{0.6}As$ having a thickness of approximately one micron. The lower cladding layer further includes an n-type second portion 54 that is compositionally graded from approximately 40% Al at the interface with the first portion 52 to approximately 20% Al. The thickness of the second portion 54 is approximately 1000 Angstroms. Underlying a lower surface of the contact layer 48 is the upper cladding layer that includes a first portion 56 comprised of p+ $Al_{0.4}Ga_{0.6}As$ having a thickness of approximately 7800 Angstroms. The upper cladding layer further includes a p-type second portion 58 that is compositionally graded from approximately 40% Al at the interface with the first portion 56 to approximately 20% Al. The thickness of the second portion 58 is approximately 1000 Angstroms. Interposed between the compositionally graded portions of the upper and the lower cladding layers is a 75 Angstrom thick unintentionally doped GaAs active region 60. Horizontal confinement of the active region 60 is accomplished by compensated regions 62 and 64. Region 62 is n-type and is a result of an implantation of Si. Region 64 is p-type and is a result of an implantation of Be.

Figure 4A:
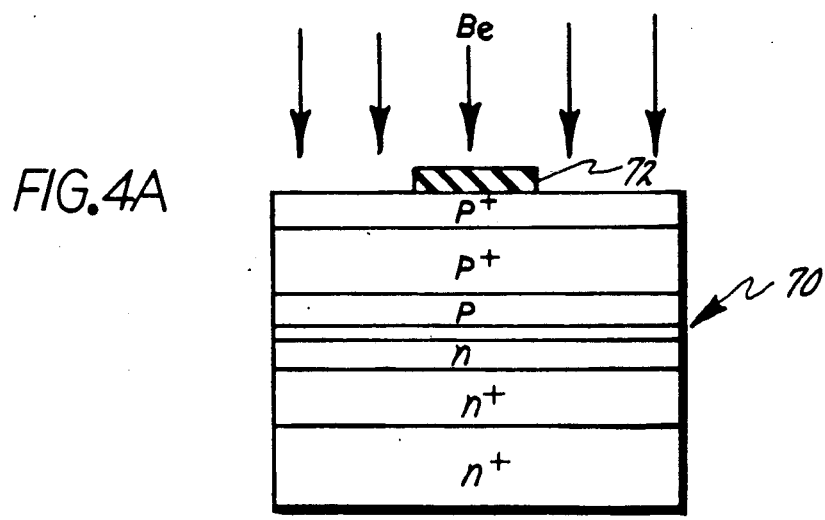
FIGS. 4A-4C illustrate several steps of a method of the invention.

As can be seen in FIG. 4A the laser 40 is fabricated from a planar heterostructure having an active quantum-well and vertically confining waveguide-cladding layers. The heterostructure is implanted with, for example, Si and Be at fluencies common for compositional disordering, to form a buried heterostructure waveguide, and to create current blocking junctions upon activation of the implants. The nature of the ion-implantation process employed, i.e., low ion dose followed by a short thermal anneal provides disordering of or smearing of the active/cladding layer interface in the implanted regions, but does not completely merge the active quantum well into the upper and lower cladding layers.

Figure 4B:
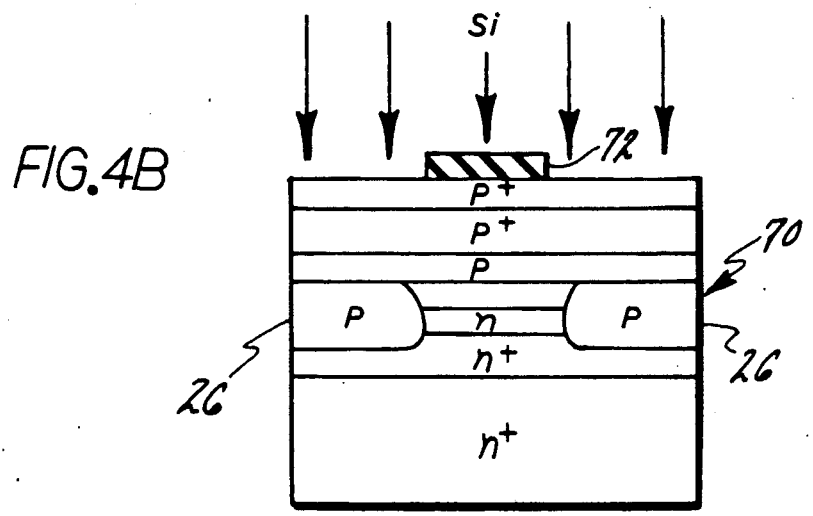
Figure 4C:
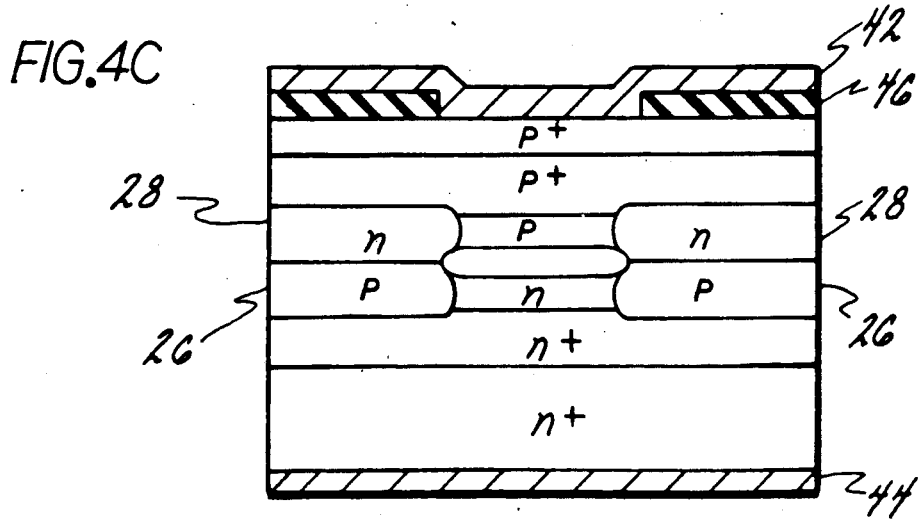

By example, FIGS. 4A-4C illustrate that the laser diode 40 may be fabricated by growing the heterostructure 70 by molecular beam epitaxy, providing a mask 72 upon the heterostructure 70 to protect the intended 10 micron wide waveguide region, implanting the masked heterostructure with, for example, Be and with Si (550KeV and 900KeV, respectively, $1.5 \times 10^{15} cm^{-2}$), and rapidly thermally annealing the implanted structure (880° C. for three seconds under Ar). A Be/Au ohmic contact 42 is applied over a window in the oxide cap layer 46, the wafer is thinned, and Ge/Au/Ni/Au metalization applied to the n-side to form the ohmic contact 44. After alloying, the wafer is cleaved into bars and the individual devices tested. The mask may be comprised of any suitable material such as photoresist or a dual-layer $SiO_2$/Au mask. Preferably both implants occur during one vacuum cycle with the implant peaks being predetermined to reside above and below the plane of the active region. Either the n-type or the p-type dopant can be implanted first, with both species being implanted through the same surface of the device.

Figure 3:
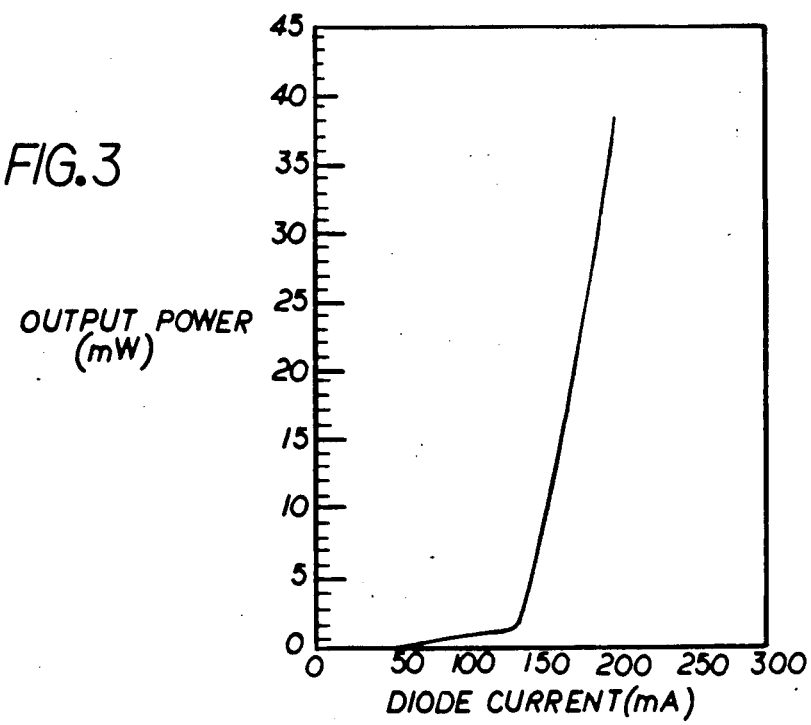
FIG. 3 is a graph showing the relationship of laser power output as a function of diode current for the laser diode illustrated in FIG. 2.

Test results of the device of FIG. 2 and FIG. 4 are shown in FIG. 3. The device was tested without heat-sinking and under pulsed conditions of 1.0 microsecond wide pulses applied at a one KHz rate. A typical light vs current curve is shown in FIG. 3. The lasers have a 134 mA threshold current and slope efficiency of 0.61 W/A. Kink-free operation, consistent with index-guiding of the laser, is observed up to the maximum tested power output of 40 mW. As a comparison, gain-guided proton-stripe lasers were fabricated from the same wafer used for the all-implanted PBH-GRIN-SCH devices. These control laser had a 5 micron wide current injection region, formed by 60 keV, $1 \times 10^{15} cm^{-2}$ proton implantation into the upper-cladding region outside the intended laser stripe. The slope efficiencies of the proton-stripe lasers were only 0.31 W/A, with kinking of the light vs current curves about 25 mA, as compared to 0.61 W/A and kink-free operation for the PBH-GRIN-SCH laser of the invention. Furthermore, the PBH-GRIN-SCH laser exhibits a typical threshold current density of 3.9 $kA/cm^2$ while the threshold current density of the proton-stripe devices is much higher at 5.4 $kA/cm^2$. The relatively high current densities of both devices indicates that material or process problems not related to the ion-implantation and annealing, such as poor ohmic contacts, may exist as is determined from subsequent PBH-GRINSCH lasers. These improved devices were fabricated with improved doping and quantum well thickness control during the material growth yielding a threshold current density of 793 $A/cm^2$, a slope efficiency of 0.60 A/W, and kink-free operation to the maximum tested output power of 70 mW while operated continuously and attached to a copper heat sink.

Demonstration of kink-free operation, increased efficiency, and reduced threshold current density of the PBH-GRIN-SCH laser device of the invention shows that ion-implantation and rapid thermal annealing provide an index-guided device due to the stable lasing operation of the PBH-GRIN-SCH laser device, despite the device having an active stripe twice as wide as the gain-guided proton-stripe control laser.

The laser of the invention has also been fabricated in InGaAs/(Ga,Al)As quantum-well heterostructures, demonstrating that this method is in no way limited to the material system described above, and can be applied to any quantum-well heterostructure system that can be doped by ion bombardment and annealing. Furthermore, a number of suitable implant species can be employed including but not limited to Selenium, Tellurium and Sulphur as n-type dopants and Zinc and Germanium a p-type dopants. Also, the specific nature of the compositional grading of the material within the cladding layers is not critical to the operation of the device and may be, by example, linear, parabolic or stepped.

Thus, while the invention has been particularly shown and described with respect to a specific embodiment thereof, it will be understood by those skilled in the art that changes in form and details may be made therein without departing from the scope and spirit of the invention.

What is claimed is:

1. A semiconductor laser device comprising:
   (a) an optical resonant cavity;
   (b) a optical waveguide layer of a high refractive index;
   (c) an upper optical waveguide cladding layer having a low refractive index and a first type of electrical conductivity, said upper cladding layer above said optical waveguide layer of high refractive index;
   (d) a lower optical waveguide cladding layer having a low refractive index and a second type of electrical conductivity, said lower cladding layer below said optical waveguide layer of high refractive index;
   (e) an active region coincident with said optical waveguide layer of high refractive index for conversion of injected current into light, said active region confined vertically by said lower and upper cladding layers;
   (f) electrode means for applying current to said device; and
   (g) reversed-biased junctions laterally adjacent to and in the plane of the active region for constraining current to flow through said active region.

2. A laser device as set forth in claim 1 wherein said reversed-biased junctions further comprise:
   (a) a first impurity compensated region within said lower optical waveguide cladding layer, said first impurity compensated region of opposite conductivity than said lower cladding layer and said first impurity compensated region laterally confining said active region; and
   (b) a second impurity compensated region within said upper optical waveguide cladding layer, said second impurity compensated region of opposite conductivity than said upper cladding layer and said second impurity compensated region laterally confining said active region;
   wherein said first impurity compensation region interfaces with said second impurity compensated region laterally adjacent to and in the plane of said confined active region to form said reverse-biased junction.

3. A laser device as set forth in claim 2 wherein said first impurity compensated region is ion implanted into said lower cladding layer and wherein said second impurity compensated region is ion implanted into said upper cladding layer.

4. A laser device as set forth in claim 3 wherein said lower cladding is n-type and said first impurity compensated region is p-type and wherein said upper cladding layer is p-type and said second impurity compensated region is n-type.

5. A laser device as set forth in claim 1 wherein said device includes an upper and a lower surface and wherein said surfaces are substantially planar.

6. A laser device as set forth in claim 3 wherein said lower and said upper cladding layers are each comprised of compositionally graded Group III–V material.

7. In a Planar-Buried-Heterostructure, Graded-Index, Separate-Confinement-Heterostructure semiconductor diode laser, a multi-quantum well active stripe disposed between a p-type compositionally graded Group III–V cladding layer and an n-type compositionally graded Group III–V cladding layer, said laser including an ion implanted n-type region within said p-type cladding layer and further including an ion implanted p-type region within said n-type cladding layer, said regions being disposed for defining a lateral extent of said active stripe.

8. In a semiconductor laser device, an arrangement comprising:
   (a) an active region:
   (b) electrode means for applying current to said device;
   (c) means for constraining current to flow through said active region, said means further comprising a first cladding layer of a first type of electrical conductivity and having a first impurity compensated region laterally adjacent to said active region, said first cladding layer disposed beneath said active region, and a second cladding layer of a second type of electrical conductivity and having a second impurity compensated region laterally adjacent to, said second cladding layer disposed above said active region.

9. A laser device as set forth in claim 8 wherein said first cladding layer is n-type and said first impurity compensated region is p-type and wherein said second cladding layer is p-type and said second impurity compensated region is n-type.

10. A laser device as set forth in claim 8 wherein said first and second cladding layers are each comprised of compositionally graded Group III–V material.

* * * * *